United States Patent
Azadet

(10) Patent No.: US 9,602,127 B1
(45) Date of Patent: Mar. 21, 2017

(54) DEVICES AND METHODS FOR PYRAMID STREAM ENCODING

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/041,326

(22) Filed: Feb. 11, 2016

(51) Int. Cl.
*H03M 7/34* (2006.01)
*H03M 7/38* (2006.01)
*H03M 7/30* (2006.01)
*H04L 29/06* (2006.01)

(52) U.S. Cl.
CPC ....... *H03M 7/3082* (2013.01); *H03M 7/3066* (2013.01); *H04L 65/607* (2013.01)

(58) Field of Classification Search
CPC .................................................. H03M 7/3082
USPC ................................ 341/50, 51, 106, 65, 67
See application file for complete search history.

(56) References Cited

U.S. PATENT DOCUMENTS

| | | | |
|---|---|---|---|
| 6,865,534 B1 * | 3/2005 | Murashima | G10L 19/12 704/219 |
| 2003/0072366 A1 * | 4/2003 | Bartolucci | G06T 9/008 375/240.04 |
| 2014/0029758 A1 * | 1/2014 | Nakadai | G10L 21/0272 381/71.1 |

* cited by examiner

*Primary Examiner* — Peguy Jean Pierre
(74) *Attorney, Agent, or Firm* — Schwegman Lundberg & Woessner, P.A.

(57) ABSTRACT

Devices and methods of reducing quantization noise using a pyramid stream encoder are generally described. Groups of D digital symbols are iteratively computed for a digital signal such that each group of symbols minimizes a norm of a weighted residue vector. The weighted residue vector is formed by applying predetermined weighting coefficients to components of a residue vector. Each component is a difference between a sample of the digital signal and a linear combination of different groups of digital symbols with predefined filter coefficients. The norm of the weighted residue vector evaluated at a rate D times slower than a sampling rate of an output signal. The groups of D digital symbols are provided as the output signal.

23 Claims, 7 Drawing Sheets

DEVICES AND METHODS FOR PYRAMID STREAM ENCODING

TECHNICAL FIELD

Embodiments pertain to digital radio encoders in electronic devices. Some embodiments relate to high speed encoders for communication devices used in cellular and wireless local area network (WLAN) networks, including Third Generation Partnership Project Long Term Evolution (3GPP LTE) networks and LTE advanced (LTE-A) networks as well as $4^{th}$ generation (4G) networks and $5^{th}$ generation (5G) networks. Some embodiments relate to digital stream encoders for use in phase locked loops (PLLs), including fractional-N PLLs, audio applications, or other Digital-to-Analog Converter (DAC) or Analog-to-Digital Converter applications (ADC).

BACKGROUND

The ever-increasing demand for various network-delivered services continues to drive new generations of communication devices. In particular, consumers demand communication devices able to deliver higher data rates. Delivery of such data rates may be achieved, for example, by increasing device speed or bandwidth. While the latter may be limited more often to network functionality, and is under development through various types of carrier aggregation, the former may be attained through improved device design.

In particular, it may be desirable to redesign digital radio encoders that are used to generate digital bit streams. Current designs of digital radio encoders are unable for various reasons to generate high data rate digital bit streams to produce analog baseband or radio frequency (RF) signal with sufficient accuracy. Nor are current digital radio encoders able to cope with dynamic distortion or in-band noise. It would thus be desirable to provide a commercially viable implementation of a bit stream radio.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION OF THE INVENTION

Figure 1:
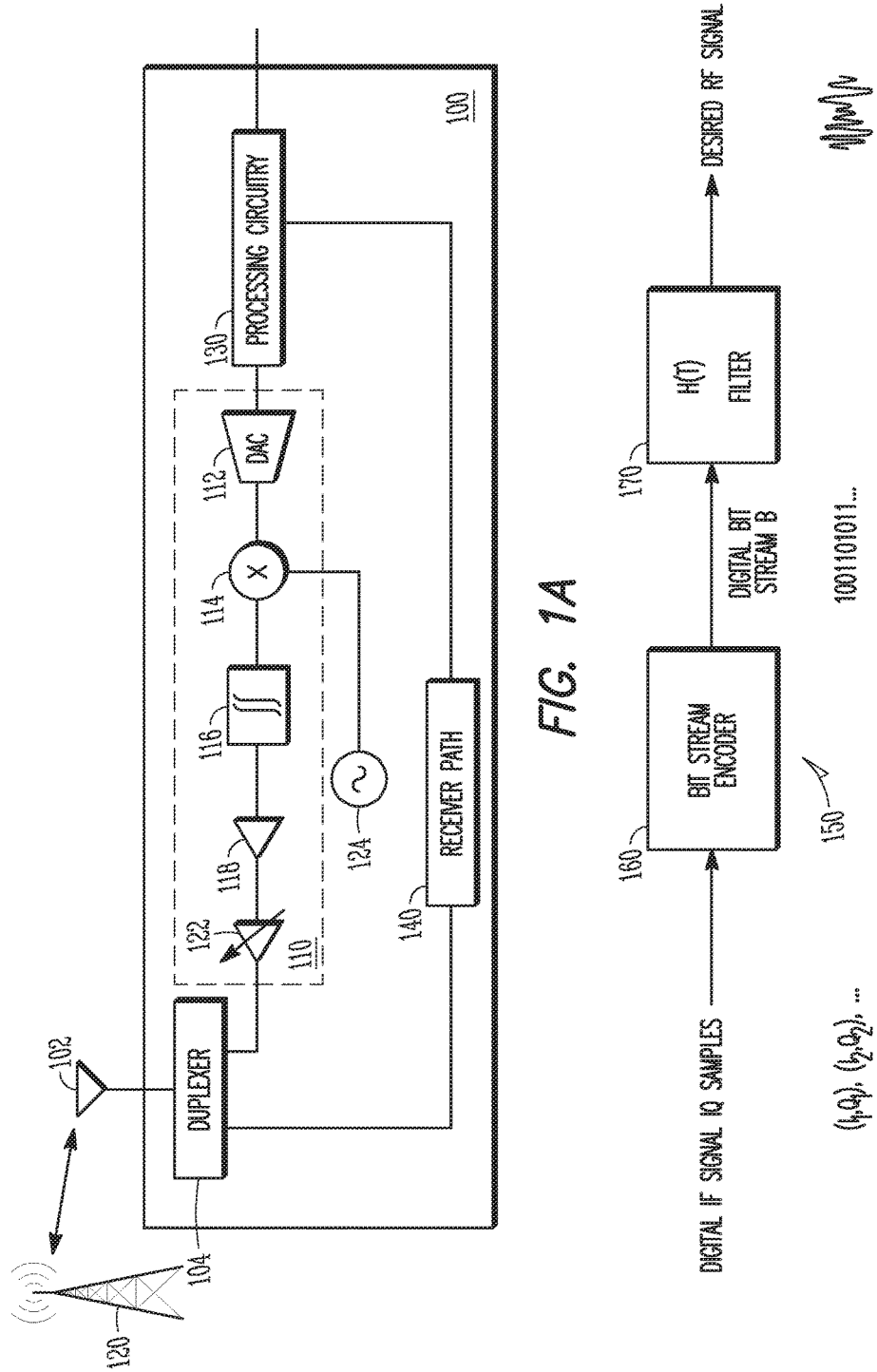
FIG. 1A is a block diagram of transmitter components in a communication device in accordance with some embodiments.
FIG. 1B is a block diagram of a pyramid stream encoder in a communication device in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

FIG. 1A is a block diagram of transmitter components in a communication device in accordance with some embodiments. The communication device 100 is simplified for convenience. The communication device 100 may include one or more antennas 102 that transmit and receive RF signals and communicate with an evolved NodeB (eNB) 120, an access point (AP) or other network device. The RF signals communicated by antenna 102 may include frequencies in one or more Long Term Evolution (LTE) bands or other communication bands. Antenna 102 may comprise one or more directional or omnidirectional antennas, including, for example, dipole antennas, monopole antennas, patch antennas, loop antennas, microstrip antennas or other types of antennas suitable for transmission of RF signals.

Antenna 102 may be connected with duplexer 104. Duplexer 104 may determine whether signals are being received or transmitted by communication device 100 and select the signal path accordingly. Specifically, duplexer 104 may pass RF signals received by antenna 102 to receiver path 140 and pass signals from transmitter path 110 to antenna 102. Although duplexer 104 may be selective, i.e., only one path may be open at a time, receiver path 140 and transmitter path 110 may not be completely isolated, that may be RF signals can leak from one path to another. As transmitter path 110 may be discussed herein, the components of receiver path 140 are not described herein for simplicity. Receiver path 140 may have similar components as transmitter path 110.

Transmitter path 110 may contain a number of components, one or more of which may not be present and some of which may not be shown for convenience. For example, several of the components may be duplicated (e.g., amplifier 118, buffer 122, or the baseband signal may be converted in stages to RF signals). As shown in FIG. 1, transmitter path 110 may include filter 116, mixer 114, power amplifier 122, buffer 118, and ADC 112. Other components, such as blocking capacitors, filters, buffers and other amplifiers may be present but are not shown for the sake of simplicity. Although a single signal may be referred to herein, similar parallel transmitter paths may be provided for in-phase (I) and quadrature-phase (Q) signals.

A digital signal may be supplied to, or generated by, processing circuitry 130, which in turn may provide digitized output signals to the transmitter path 140. In some embodiments, processing circuitry 130 may process signals at baseband. The digital signals from processing circuitry 130 may be supplied to digital-to-analog converter (DAC) 112. DAC 112 may convert the signals to baseband or intermediate frequency (IF) analog signals. In some embodiments, DAC 112 may be in the processing circuitry.

The analog signals from DAC 112 may be upconverted to RF frequencies, such as 2 GHz or other LTE-band frequencies. The upconversion may be performed by mixer 114. Mixer 114 may be supplied with local oscillator (LO) signals from local oscillator 124 or a synthesizer that feeds transmitter path 110. To upconvert the RF signal from a baseband signal to a RF signal, mixer 114 may receive the input signal as well as a mixing frequency, and generate fundamental frequencies at a difference of the baseband signal and the mixing frequency LO signal ($f_{LO}$–f) and a sum of the baseband signal and the mixing frequency LO signal (f+$f_{LO}$) as well as harmonics of fundamental frequencies.

The RF signals from mixer 114 may then be supplied to bandpass filter 116, where the RF signal may be filtered to pass only RF signals in the desired frequency range to avoid transmitting spurious signals to the amplification components. Bandpass filter 116 may provide one or both signals. Prior to upconversion, the analog baseband signals may be filtered by a lowpass filter (not shown). The lowpass filter, like mixer 114, may be disposed in processing circuitry 130.

Once filtered by bandpass filter 116, the RF signal may be then provided to buffer 118. At buffer 118 the signal may be attenuated to reduce the signal strength to a sufficient low level. The buffered RF signals may then provided to power amplifier 122 where the signal may be amplified. power amplifier 122 may be, for example, a variable amplifier whose amplification may be tuned as desired based on the transmit signal strength. The attenuation provided by buffer 118 may be selected to ensure that power amplifier 122 is not saturated when amplifying the RF signals. The amplified signals from power amplifier 122 may be supplied to duplexer 104 for transmission.

Communication device 100 may communicate with other local or remote devices, such as personal communication devices (e.g., smartphones) or network communication devices (e.g., evolved node Bs (eNBs)) over the air with, for example, an LTE network. The LTE network may be a LTE and LTE Advanced (LTE-A) networks as well as other versions of LTE networks to be developed. The network 100 may comprise a radio access network (RAN) (e.g., evolved universal terrestrial radio access network (E-UTRAN)) and core network (e.g., shown as an evolved packet core (EPC)) coupled together through an S1 interface. The eNBs may include macro eNBs and low power (LP) eNBs.

Communication device 100 may also connect to the network via a secure (or unsecure) access point.

A pyramid stream encoder may encompass some of the components shown in FIG. 1A. FIG. 1B is a block diagram of a pyramid stream encoder in a communication device in accordance with some embodiments. Pyramid stream encoder 150 may include bit stream encoder 160 and h(t) filter 170. Pyramid stream encoder 150 may be included in processing circuitry 130 and may also include DAC 112, mixer 114 and filter 116.

In particular, pyramid stream encoder 150 may be supplied with digital samples. The samples may be baseband or IF digital signals. The samples may include IQ data, shown as sample pairs ($I_n,Q_n$), n≥1. The samples may be single carrier or multi-carrier. If multi-carrier, the samples may include Institute of Electrical and Electronic Engineers (IEEE) 802.11 wireless technology (WiFi), global system for mobile communications (GSM), enhanced data rates for GSM evolution (EDGE), GSM EDGE radio access network (GERAN), universal mobile telecommunications system (UMTS), Wideband Code Division Multiplexing Access (WCDMA), or other 2G, 3G, 4G, 5G, etc. technologies either already developed or to be developed. In other embodiments, the signals and frequencies may be used in other, non-communication applications using a DAC or an ADC, such as audio applications and phase locked loops (PLLs), including fractional-N PLLs or polar transmitters.

Bit stream encoder 160, upon receiving the signal, may convert the IQ samples into a digital bit stream. That is, bit stream encoder 160 may provide a stream of binary data. The stream of binary data may then be supplied to h(t) filter 170. h(t) filter 170 may, in turn, convert the binary data to a desired analog RF signal. Bit stream encoder 160 may essentially operate by determining a bit stream sequence such that the filter output (after h(t) filter 170) is as close as possible to the desired digital RF signal. Depending on the implementation, h(t) filter 170 may operate at baseband or at RF frequencies, as discussed in more detail below.

Figure 2:
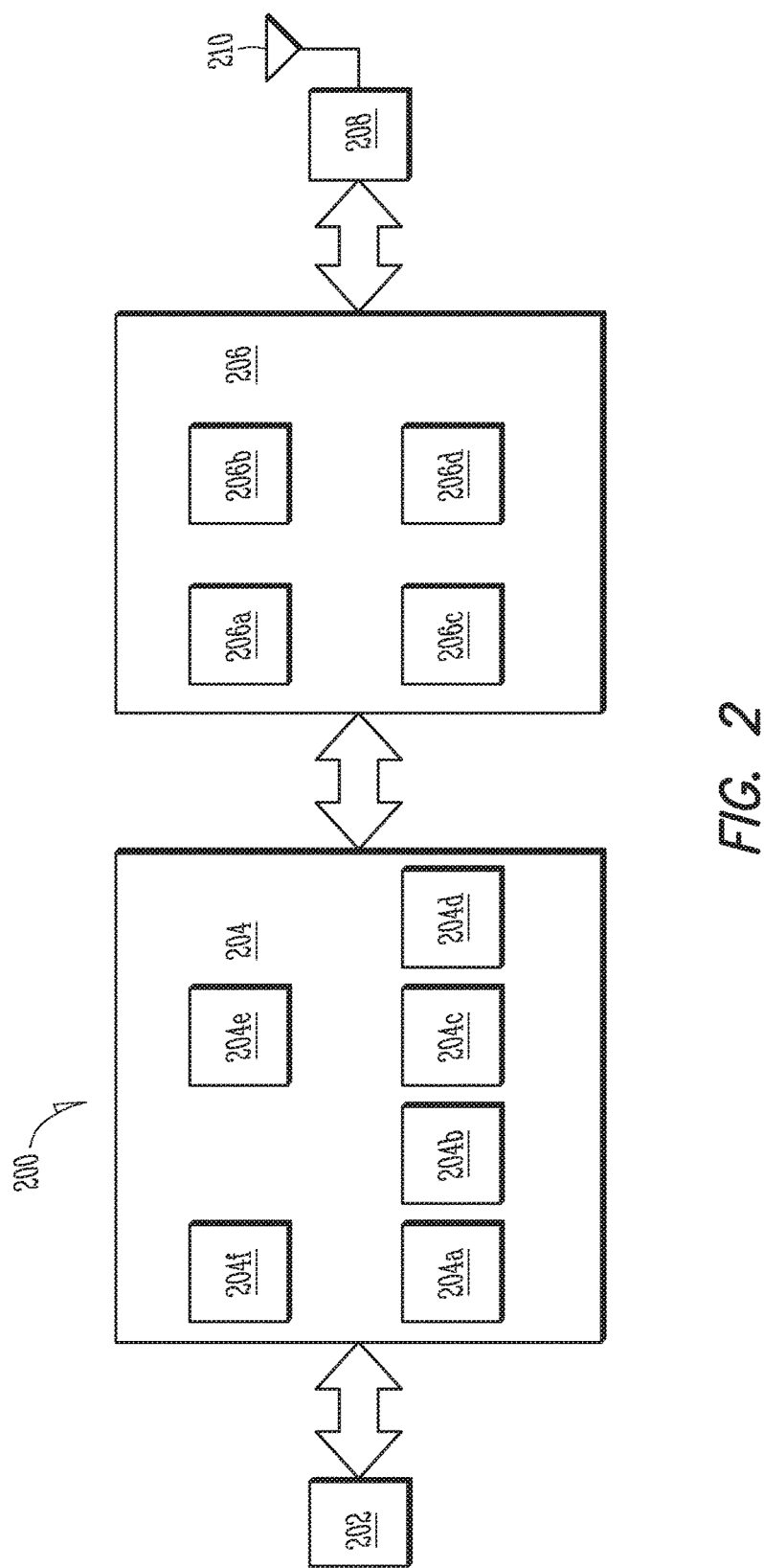
FIG. 2 illustrates components of a communication device in accordance with some embodiments.

Embodiments described herein may be implemented into a system using any suitably configured hardware and/or software. FIG. 2 illustrates components of a communication device in accordance with some embodiments. At least some of the components shown may be used in the communication device shown in FIG. 1. The communication device 200 and other components may be configured to use the synchronization signals as described herein. The communication device 200 may be one of the communication devices 102 shown in FIG. 1 and may be a stationary, non-mobile device or may be a mobile device. In some embodiments, the communication device 200 may include application circuitry 202, baseband circuitry 204, RF circuitry 206, front-end module (FEM) circuitry 208 and one or more antennas 210, coupled together at least as shown. At least some of the baseband circuitry 204. RF circuitry 206, and FEM circuitry 208 may form a transceiver.

The application or processing circuitry 202 may include one or more application processors. For example, the application circuitry 202 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 204 may include circuitry such as, but not limited to, one or more single-core or multi-core processors. The baseband circuitry 204 may include one or more baseband processors and/or control logic to process baseband signals received from a receive signal path of the RF circuitry 206 and to generate baseband signals for a transmit signal path of the RF circuitry 206. Baseband processing circuitry 204 may interface with the application circuitry 202 for generation and processing of the baseband signals and for controlling operations of the RF circuitry 206. For example, in some embodiments, the baseband circuitry 204 may include a second generation (2G) baseband processor 204a, third generation (3G) baseband processor 204b, fourth generation (4G) baseband processor 204c, and/or other baseband processor(s) 204d for other existing generations, generations in development or to be developed in the future (e.g., fifth generation (5G), 6G, etc.). The baseband circuitry 204 (e.g., one or more of baseband processors 204a-d) may handle various radio control functions that enable communication with one or more radio networks via the RF circuitry 206. The radio control functions may include, but are not limited to, signal modulation/demodulation, encoding/decoding, radio frequency shifting, etc. In some embodiments, modulation/demodulation circuitry of the baseband circuitry 204 may include FFT, precoding, and/or constellation mapping/demapping functionality. In some embodiments, encoding/decoding circuitry of the baseband circuitry 204 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 204 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 204e of the baseband circuitry 204 may be configured to run elements of the protocol stack for signaling of the PHY, MAC, RLC, PDCP and/or RRC layers. In some embodiments, the baseband circuitry may include one or more audio digital signal processor(s) (DSP) 204f. The audio DSP(s) 204f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 204 and the application circuitry 202 may be implemented together such as, for example, on a system on a chip (SOC).

In some embodiments, the baseband circuitry 204 may provide for communication compatible with one or more radio technologies. For example, in some embodiments, the baseband circuitry 204 may support communication with an evolved universal terrestrial radio access network (E-UTRAN) and/or other wireless metropolitan area networks (WMAN), a wireless local area network (WLAN), a wireless personal area network (WPAN). Embodiments in which the baseband circuitry 204 is configured to support radio communications of more than one wireless protocol may be referred to as multi-mode baseband circuitry. In some embodiments, the device can be configured to operate in accordance with communication standards or other protocols or standards, including IEEE 802.16 wireless technology (WiMax), IEEE 802.11 wireless technology (WiFi) including IEEE 802.11 ad, which operates in the 60 GHz millimeter wave spectrum, various other wireless technologies such as GSM, EDGE, GERAN, UMTS, UTRAN, or other 2G, 3G, 4G, 5G, etc. technologies either already developed or to be developed.

RF circuitry 206 may enable communication with wireless networks using modulated electromagnetic radiation through a non-solid medium. In various embodiments, the RF circuitry 206 may include switches, filters, amplifiers, etc. to facilitate the communication with the wireless network. RF circuitry 206 may include a receive signal path which may include circuitry to down-convert RF signals received from the FEM circuitry 208 and provide baseband signals to the baseband circuitry 204. RF circuitry 206 may also include a transmit signal path which may include circuitry to up-convert baseband signals provided by the baseband circuitry 204 and provide RF output signals to the FEM circuitry 208 for transmission.

In some embodiments, the RF circuitry 206 may include a receive signal path and a transmit signal path. The receive signal path of the RF circuitry 206 may include mixer circuitry 206a, amplifier circuitry 206b and filter circuitry 206c. The transmit signal path of the RF circuitry 206 may include filter circuitry 206c and mixer circuitry 206a. RF circuitry 206 may also include synthesizer circuitry 206d for synthesizing a frequency for use by the mixer circuitry 206a of the receive signal path and the transmit signal path. In some embodiments, the mixer circuitry 206a of the receive signal path may be configured to down-convert RF signals received from the FEM circuitry 208 based on the synthesized frequency provided by synthesizer circuitry 206d. The amplifier circuitry 206b may be configured to amplify the down-converted signals and the filter circuitry 206c may be a low-pass filter (LPF) or band-pass filter (BPF) configured to remove unwanted signals from the down-converted signals to generate output baseband signals. Output baseband signals may be provided to the baseband circuitry 204 for further processing. In some embodiments, the output baseband signals may be zero-frequency baseband signals, although this is not a requirement. In some embodiments, mixer circuitry 206a of the receive signal path may comprise passive mixers, although the scope of the embodiments is not limited in this respect.

In some embodiments, the mixer circuitry 206a of the transmit signal path may be configured to up-convert input baseband signals based on the synthesized frequency provided by the synthesizer circuitry 206d to generate RF output signals for the FEM circuitry 208. The baseband signals may be provided by the baseband circuitry 204 and may be filtered by filter circuitry 206c. The filter circuitry 206c may include a low-pass filter (LPF), although the scope of the embodiments is not limited in this respect.

In some embodiments, the mixer circuitry 206a of the receive signal path and the mixer circuitry 206a of the transmit signal path may include two or more mixers and may be arranged for quadrature downconversion and/or upconversion respectively. In some embodiments, the mixer circuitry 206a of the receive signal path and the mixer circuitry 206a of the transmit signal path may include two or more mixers and may be arranged for image rejection (e.g., Hartley image rejection). In some embodiments, the mixer circuitry 206a of the receive signal path and the mixer circuitry 206a may be arranged for direct downconversion and/or direct upconversion, respectively. In some embodiments, the mixer circuitry 206a of the receive signal path and the mixer circuitry 206a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 206 may include analog-to-digital converter (ADC) and digital-to-analog converter (DAC) circuitry and the baseband circuitry 204 may include a digital baseband interface to communicate with the RF circuitry 206. In some dual-mode embodiments, a separate radio IC circuitry may be provided for processing signals for each spectrum, although the scope of the embodiments is not limited in this respect.

In some embodiments, the synthesizer circuitry 206d may be a fractional-N synthesizer or a fractional N/N+1 synthesizer, although the scope of the embodiments is not limited in this respect as other types of frequency synthesizers may be suitable. For example, synthesizer circuitry 206d may be a delta-sigma synthesizer, a frequency multiplier, or a synthesizer comprising a phase-locked loop with a frequency divider.

The synthesizer circuitry 206d may be configured to synthesize an output frequency for use by the mixer circuitry 206a of the RF circuitry 206 based on a frequency input and a divider control input. In some embodiments, the synthesizer circuitry 206d may be a fractional N/N+1 synthesizer.

In some embodiments, frequency input may be provided by a voltage controlled oscillator (VCO), although that is not a requirement. Divider control input may be provided by either the baseband circuitry 204 or the applications processor 202 depending on the desired output frequency. In some embodiments, a divider control input (e.g., N) may be determined from a look-up table based on a channel indicated by the applications processor 202.

Synthesizer circuitry 206d of the RF circuitry 206 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+(e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 206d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency ($f_{LO}$). In some embodiments, the RF circuitry 206 may include an IQ/polar converter.

FEM circuitry 208 may include a receive signal path which may include circuitry configured to operate on RF signals received from one or more antennas 210, amplify the received signals and provide the amplified versions of the received signals to the RF circuitry 206 for further processing. FEM circuitry 208 may also include a transmit signal path which may include circuitry configured to amplify signals for transmission provided by the RF circuitry 206 for transmission by one or more of the one or more antennas 210.

In some embodiments, the FEM circuitry 208 may include a TX/RX switch to switch between transmit mode and receive mode operation. The FEM circuitry may include a receive signal path and a transmit signal path. The receive signal path of the FEM circuitry may include a low-noise amplifier (power amplifier) to amplify received RF signals and provide the amplified received RF signals as an output (e.g., to the RF circuitry 206). The transmit signal path of the FEM circuitry 208 may include a power amplifier (PA) to amplify input RF signals (e.g., provided by RF circuitry 206), and one or more filters to generate RF signals for subsequent transmission (e.g., by one or more of the one or more antennas 210).

In some embodiments, the communication device 200 may include additional elements such as, for example, memory/storage, display, camera, sensor, and/or input/output (I/O) interface as described in more detail below. In some embodiments, the communication device 200 described herein may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the communication device 200 may include one or more user interfaces designed to enable user interaction with the system and/or peripheral component interfaces designed to enable peripheral component interaction with the system. For example, the communication device 200 may include one or more of a keyboard, a keypad, a touchpad, a display, a sensor, a non-volatile memory port, a universal serial bus (USB) port, an audio jack, a power supply interface, one or more antennas, a graphics processor, an application processor, a speaker, a microphone, and other I/O components. The display may be an LCD or LED screen including a touch screen. The sensor may include a gyro sensor, an accelerometer, a proximity sensor, an ambient light sensor, and a positioning unit. The positioning unit may communicate with components of a positioning network, e.g., a global positioning system (GPS) satellite.

The antennas 210 may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas 210 may be effectively separated to take advantage of spatial diversity and the different channel characteristics that may result.

Although the communication device 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

Figure 3:
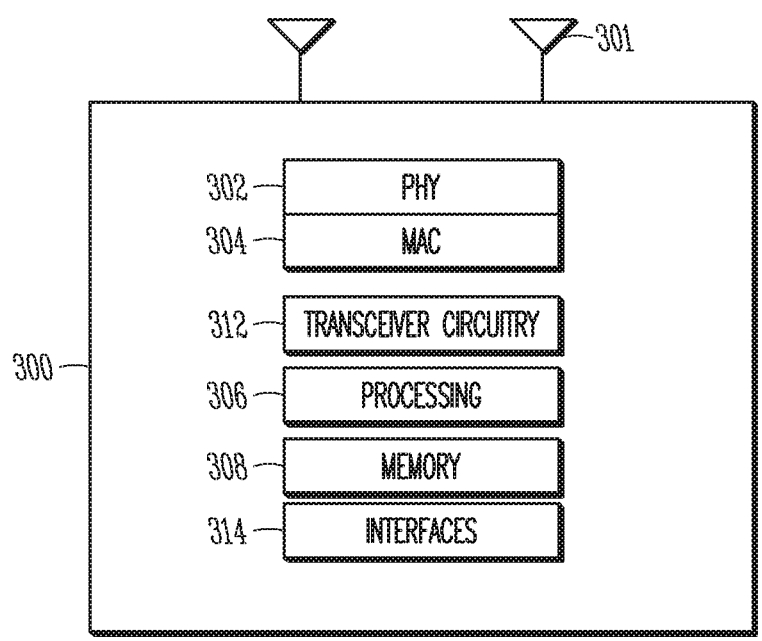
FIG. 3 illustrates a block diagram of a communication device in accordance with some embodiments.

FIG. 3 is a block diagram of a communication device in accordance with some embodiments. The device may be a communication device, for example, such as the communication device shown in FIG. 1. The physical layer circuitry 302 may perform various encoding and decoding functions that may include formation of baseband signals for transmission and decoding of received signals. The communication device 300 may also include medium access control layer (MAC) circuitry 304 for controlling access to the wireless medium. The communication device 300 may also include processing circuitry 306, such as one or more single-core or multi-core processors, and memory 308 arranged to perform the operations described herein. The physical layer circuitry 302, MAC circuitry 304 and processing circuitry 306 may handle various radio control functions that enable communication with one or more radio networks compatible with one or more radio technologies and, for example, may contain an LTE stack. The radio control functions may include signal modulation, encoding, decoding, radio frequency shifting, etc. For example, similar to the device shown in FIG. 2, in some embodiments, communication may be enabled with one or more of a WMAN, a WLAN, and a WPAN. In some embodiments, the communication device 300 can be configured to operate in accordance with 3GPP standards or other protocols or standards, including WiMax, WiFi, WiGig, GSM, EDGE, GERAN, UMTS, UTRAN, or other 3G, 3G, 4G, 5G, etc. technologies either already developed or to be developed. The communication device 300 may include transceiver circuitry 312 to enable communication with other external devices wirelessly and interfaces 314 to enable wired communication with other external devices. As another example, the transceiver circuitry 312 may perform various transmission and reception functions such as conversion of signals between a baseband range and a Radio Frequency (RF) range.

The antennas 301 may comprise one or more directional or omnidirectional antennas, including, for example, dipole antennas, monopole antennas, patch antennas, loop antennas, microstrip antennas or other types of antennas suitable for transmission of RF signals. In some MIMO embodiments, the antennas 301 may be effectively separated to take advantage of spatial diversity and the different channel characteristics that may result.

Although the communication device 300 is illustrated as having several separate functional elements, one or more of the functional elements may be combined and may be implemented by combinations of software-configured elements, such as processing elements including DSPs, and/or other hardware elements. For example, some elements may comprise one or more microprocessors, DSPs, FPGAs, ASICs, RFICs and combinations of various hardware and logic circuitry for performing at least the functions described herein. In some embodiments, the functional elements may refer to one or more processes operating on one or more processing elements. Embodiments may be implemented in one or a combination of hardware, firmware and software. Embodiments may also be implemented as instructions stored on a computer-readable storage device, which may be read and executed by at least one processor to perform the operations described herein.

Figure 4:
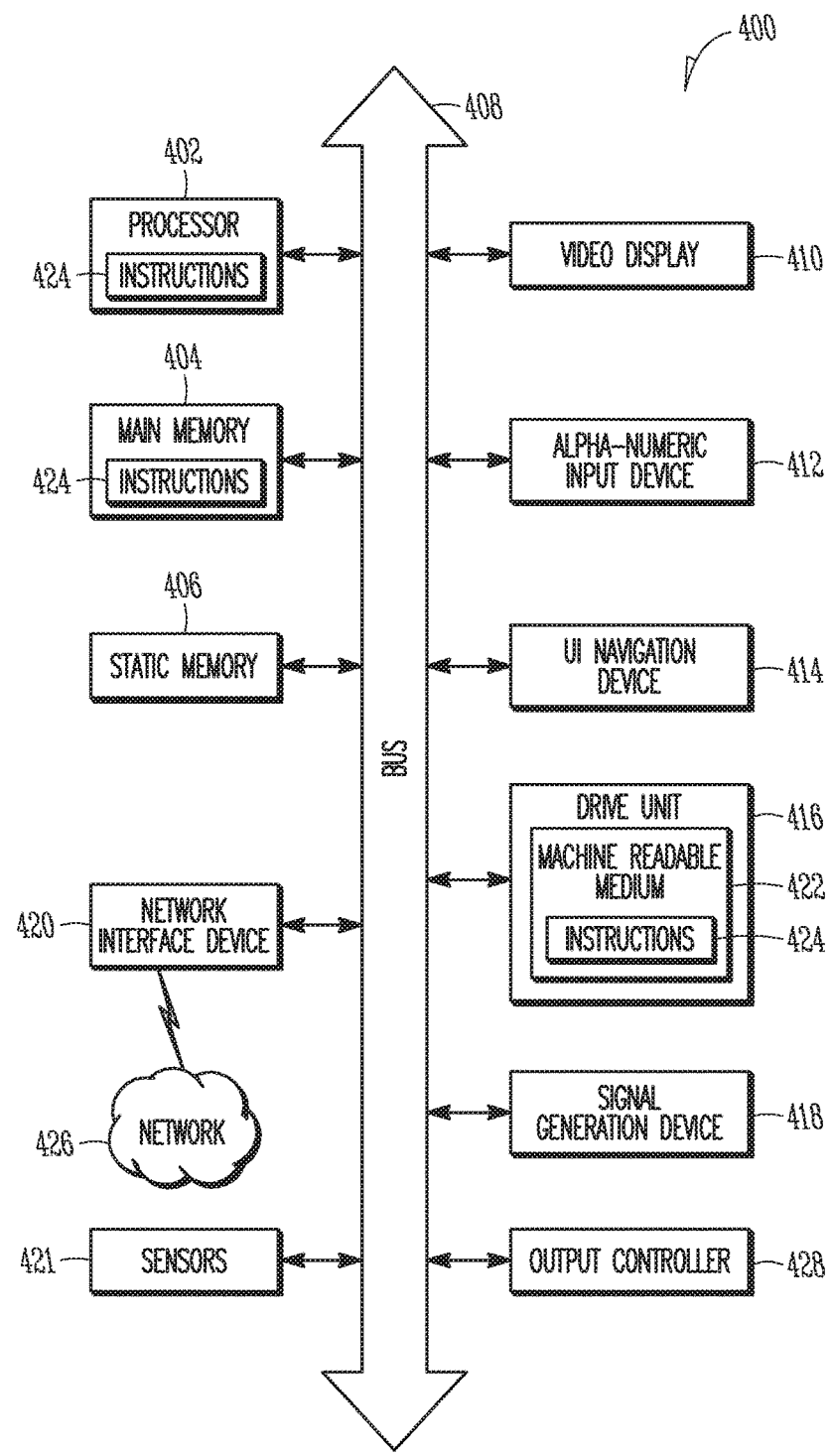
FIG. 4 illustrates another block diagram of a communication device in accordance with some embodiments.

FIG. 4 illustrates another block diagram of a communication device in accordance with some embodiments. In alternative embodiments, the communication device 400 may operate as a standalone device or may be connected (e.g., networked) to other communication devices. In a networked deployment, the communication device 400 may operate in the capacity of a server communication device, a client communication device, or both in server-client network environments. In an example, the communication device 400 may act as a peer communication device in peer-to-peer (P2P) (or other distributed) network environment. The communication device 400 may be a communication device, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The communication device 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The communication device 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The communication device 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 416 may include a communication device readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the communication device 400. In an example, one or any combination of the hardware processor 402, the main memory 404, the static memory 406, or the storage device 416 may constitute communication device readable media.

While the communication device readable medium 422 is illustrated as a single medium, the term "communication device readable medium" may include a single medium or multiple media (e.g., a centralized or distributed database, and/or associated caches and servers) configured to store the one or more instructions 424.

The term "communication device readable medium" may include any medium that is capable of storing, encoding, or carrying instructions for execution by the communication device 400 and that cause the communication device 400 to perform any one or more of the techniques of the present disclosure, or that is capable of storing, encoding or carrying data structures used by or associated with such instructions. Non-limiting communication device readable medium examples may include solid-state memories, and optical and magnetic media. Specific examples of communication device readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device readable media may include non-transitory communication device readable media. In some examples, communication device readable media may include communication device readable media that is not a transitory propagating signal.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to wirelessly communicate using at least one of single-input multiple-output (SIMO), MIMO, or multiple-input single-output (MISO) techniques. In some examples, the network interface device 420 may wirelessly communicate using Multiple User MIMO techniques. The term "transmission medium" shall be taken to include any intangible medium that is capable of storing, encoding or carrying instructions for execution by the communication device 400, and includes digital or analog communications signals or other intangible medium to facilitate communication of such software.

As above, communication devices may contain a number of components to permit communications through a LTE or other network. One of these components may include a pyramid stream encoder. While different implementations of encoders exist, encoders that provide multi-gigabit per second (GSPS) rates may be unable to be obtained in practical implementations. The different encoders used to generate oversampled bit streams may include high order Delta-Sigma DACs and Viterbi (trellis) decoding/encoding. Delta-Sigma DACs use a prediction filter to predict the quantization noise, i.e., future quantization error using past quantization error samples, and subtract the noise from the current signal. However, operating frequency and power are problematic. For example, a 100 MHz Bandwidth obtained using a sampling rate of 8 GSPS, causes the encoder to operate at 8 GHz, a frequency that is unobtainable by any available technology. Implementation of the prediction filter at frequencies greater than 1 GHz, such as those commonly used in LTE signals, is thus unattainable, and furthermore results in an exceedingly high power consumption due to the presence of large number of multipliers operating at very high frequency.

Viterbi encoding, on the other hand, may be able to provide maximum signal power for a given dynamic range and signal bandwidth, but has an extended impulse response due to the large number of taps (e.g., 256 taps or more resulting in at least $2^{256}$ states) for the finite input response (FIR) filter. Viterbi decoding seeks to find the optimum binary bit stream such that the difference from the original digital RF signal is minimized after applying the filter to all possible paths. Sub-optimum trellis decoding techniques, such as use of an M (e.g. M=16 or 32) algorithm where at one time only the best M paths are retained (i.e., a sub-optimal version of the Viterbi algorithm), can be used to reduce decoding complexity (and increasing speed). However, as a path metric (measurement of approximation squared error) is computed at every clock. M algorithm decoders are still unable to reach GSPS rates. Moreover, because M algorithm decoders do not track all possible states, the decoder may lose synchronization if none of the states tracked leads to a good solution and thus need to be reset, in addition to being unable to obtain GSPS rates.

Instead, a pyramid stream encoder using an iterative approach with decimated encoding may be employed as described below. Decimated encoding may take advantage of the relatively narrow bandwidth of the RF signal compared to the bit stream sampling rate, which is oversampled to minimize effect of in band quantization noise. A min-max optimization using decimated error values may result in the minimum of maximum quantization error in continuous time. This makes it possible to evaluate and minimize the error in blocks of D bits. D may be, for example, 8 or 10 bits.

This permits the clock used for the pyramid stream encoder to be reduced by D. For example, if the desired output signal is 8 GHz and chunks of 10 bits are computed, the pyramid stream encoder may operate at 800 MHz.

The components of the encoder may be connected to provide an iterative approach, forming a pyramid stream encoder and permitting a search in multi-dimensional space of bit stream candidates minimizing the quantization error. The optimization may be performed considering not only quantization noise at current time, but also the impact that each decision has on the encoder's ability to keep the quantization error small in the future. Residues, the difference between the input to a stage and the filter response and codeword, may be used to quantify the impact of the decision on the future. To achieve a low quantization error, the residues may remain below a predetermined threshold at all times. In some embodiments, the pyramid stream encoder can be implemented using a look-up table (LUT) and adders and registers. Simulations show that the encoder may operate at 1 GHz for a sampling rate of 8-10 GSPS (D=8 or D=10), a conventional 10 Gbps producing multi-carrier LTE signals with ~60 dB dynamic range and a two tone spurious-free dynamic range (SFDR) of ~80 dB. Various implementations of the digital bit stream encoder described below may be located in a processor, such as that shown in FIG. 1, and include a bit stream encoder and filter.

As above, ML encoders such as Viterbi encoders are unable to generate multi-GHz signals, e.g., 2.6 GHz LTE signals or 2.4 GHz/5 GHz WiFi signals, as such encoders constantly calculate the squared error and use a bit stream sampling rate on the order of the RF frequency. Such a sampling rate is desirable for an encoder to support bandwidth (BW) signals for eNB applications, to ensure that sin(x)/x attenuation (droop) is minimized, and to maximize an oversampling ratio to achieve a high dynamic range, which may minimize in-band quantization noise. It may be desirable to provide an encoder able to achieve a sampling rate of at least 8 GSPS even with a BW that is relatively narrow (100 MHz) compared with the center RF frequency (several GHz).

In embodiments in which a bit stream encoder is able to obtain a perfect approximation of the above signal in-band and produces out-of-band noise, although the digital bit stream has a BW>>signal BW, after applying an analog filter, the resulting analog output signal may also be BW limited by construction and has the same BW as the desired signal. Because the output of the modulator (after filtering) and the signal are both BW limited, the error signal (which is the difference between these two signals) may also be BW limited. According to the Nyquist theorem, a sampling rate of 2×BW (decimated sampling rate) is sufficient to reproduce the original signal without loss of information. A pyramid stream encoder using such a decimated sampling rate can thus compute the bit stream that minimizes not the mean square error, but the mean square decimated error to provide the desired speed and accuracy. Consider the error signal:

$$e(n) = x(n) - \sum_{k=0}^{N-1} h_k s(n-k)$$

where x is the input signal, h is the filter response and s is the sample. After decimation by a factor D, this becomes:

$$e(mD) = x(mD) - \sum_{k=0}^{N-1} h_k s(mD-k)$$

For simplicity, it is assumed that the number of taps of the filter (such as that shown in FIG. 1B) is proportional to or is a multiple of the decimation factor D. Thus, by regrouping the D taps:

$$e(mD) = x(mD) - \sum_{i=0}^{N/D-1} \sum_{j=0}^{D-1} h_{iD+j} s(mD - iD - j)$$

Using a more compact vector representation:

$$e_m = x_m - \sum_{i=0}^{N/D-1} h_i^T s_{m-i}$$

Figure 7A:
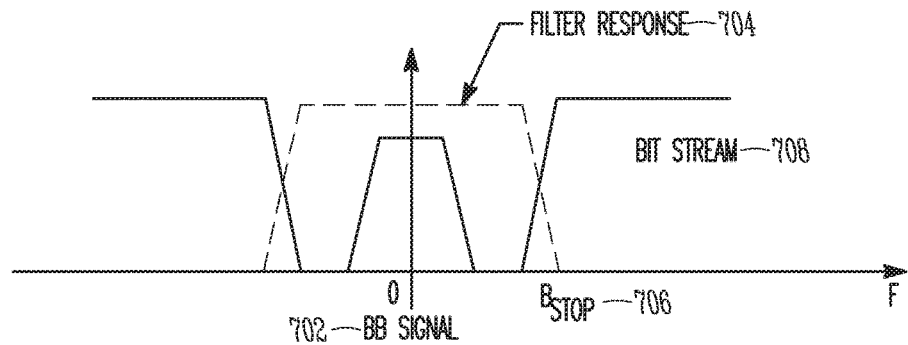
FIGS. 7A and 7B illustrate frequency responses in accordance with some embodiments.
Figure 7B:
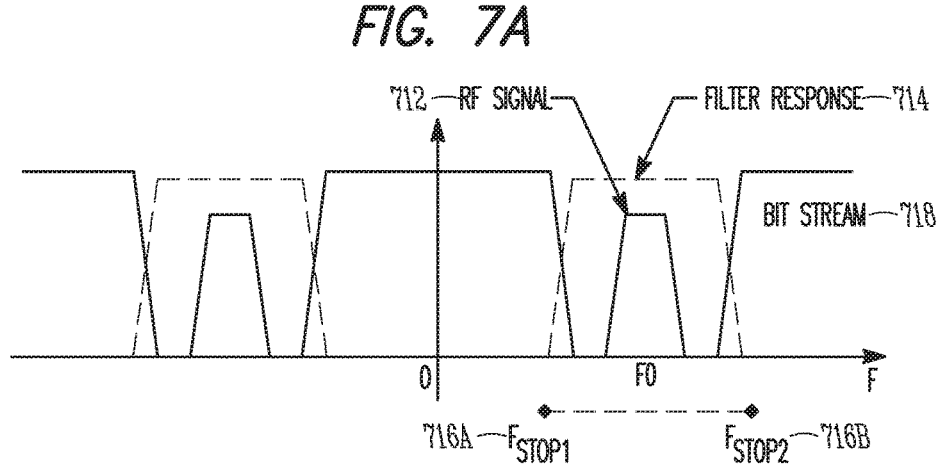

The decimation factor D may be chosen as the ratio between the Nyquist frequency Fs/2 and the signal BW B. Thus, D≤Fs/2B. In practice, because the filter has a finite roll off, B may be considered the stop band frequency of the filter, i.e. D≤Fs/2Bstop. FIGS. 7A and 7B illustrate frequency responses in accordance with some embodiments. In particular, FIG. 7A illustrates a baseband frequency response in which the baseband signal 702 is centered around a baseband frequency, and centered within a lowpass filter response 704 having a stop band frequency $B_{stop}$ 706. The bit stream 708 extends throughout the frequency spectrum show in FIG. 7A, tailoring off in the band of the filter response 704. FIG. 7B, on the other hand, illustrates a bandpass frequency response in which the bandpass signal 712 is centered around $f_0$. The bandpass signal 712 is also centered within a bandpass filter response 714 having stop band frequencies $f_{stop1}$ 716a (closer to baseband) and $f_{stop2}$ 716b (farther from baseband). The bit stream 718 extends throughout the frequency spectrum show in FIG. 7B, tailoring off in the band of the bandpass filter response 714.

The above expression is for baseband signals. If the pyramid stream encoder uses passband/RF signals (centered at $f_0$):

$$e(n) = x(n) - \sum_{k=0}^{N-1} h_k s(n-k) e^{-j\omega_0(n-k)T_s}$$

The quadratic error becomes:

$$|e(n)|^2 = \left| x(n) - \sum_{k=0}^{N-1} h_k s(n-k) e^{-j\omega_0(n-k)T_s} \right|^2$$

This expression can be re-written as:

$$|e(n)|^2 = \left| x(n) e^{j\omega_0 nT_s} - \sum_{k=0}^{N-1} h_k e^{j\omega_0 kT_s} s(n-k) \right|^2$$

And after decimation by a factor D becomes:

$$|e(nD)|^2 = \left| x(nD)e^{j\omega_0 DT_s} - \sum_{k=0}^{N-1} h_k e^{j\omega_0 kT_s} s(nD-k) \right|^2$$

or in an expanded form:

$$|e(nD)|^2 == \left( x_r(nD)\cos(\omega_0 nDT) - x_i(nD)\sin(\omega_0 nDT) - \sum_{k=0}^{N-1} h_k \cos(\omega_0 kT) s(nD-k) \right)^2 +$$

$$\left( x_r(nD)\sin(\omega_0 nDT) + x_i(nD)\cos(\omega_0 nDT) - \sum_{k=0}^{N-1} h_k \sin(\omega_0 kT) s(nD-k) \right)^2$$

In a vector format, the error can still be written using the same expression as in the baseband case:

$$e_m = x_m - \sum_{i=0}^{N/D-1} g_i^T s_{m-i}$$

The impulse response g is the passband version of the baseband filter function h (i.e., h modulated by the frequency $f_0$). In the RF/passband case, the decimation factor D may take into account the finite roll-off of the filter. The signal bandwidth may be determined to be the difference between the stopband frequencies of the filter rather than the actual signal bandwidth. In addition, because the bit stream sequence may typically be real and not complex (e.g., directly RF and not modulated by a quadrature-phase RF mixer), the signal bandwidth may be less than the Nyquist frequency Fs/2 and not the sampling frequency Fs. Thus, $D \leq Fs/2(f_{stop2} - f_{stop1})$.

In the following, x(t) is the continuous time version of the input signal (after continuous time filtering), y(t) is the bit stream continuous time output after filtering, and e(t) is the error signal x(t)−y(t). If the above signals are RF signals, they can be converted from baseband signals as shown previously, resulting in a complex error. $e_k$ are the discrete samples of the continuous time quantization error signal, when sampled at a sampling rate equal to 2B, where B is the signal BW (minimum sampling rate without aliasing). In embodiments in which the filtered bit stream output RF signal y(t) is a real signal, the y(t) spectrum has symmetrical positive and negative frequency content. To simplify the analysis, the case where the synthesized RF signal is sinusoidal, centered at $f_0$, and the filter h is an ideal brick-wall filter, with unity gain at DC is considered. In the case of an ideal encoder and in the absence of quantization error:

$$e(n) = x(n) - \sum_{k=0}^{N-1} h_k s(n-k) e^{-j\omega_0(n-k)T_s} =$$

$$0 \Rightarrow |x(n)| = \left| \sum_{k=0}^{N-1} h_k e^{-j\omega_0(n-k)T_s} A_{RF} \frac{e^{j\omega_0(n-k)T_s} - e^{-j\omega_0(n-k)T_s}}{2j} \right|$$

Therefore the maximum magnitude of the complex baseband signal is:

$$x_{max} = |x(n)| = \frac{A_{RF}}{2} \left| \sum_{k=0}^{N-1} h_k + \sum_{k=0}^{N-1} h_k e^{-2j\omega_0(n-k)T_s} \right|$$

Because h is an ideal unity gain brick-wall filter, $\Sigma_{k=0}^{N-1} h_k = 1$, and $$\sum_{k=0}^{N-1} h_k e^{-2j\omega_0(n-k)T_s} = 0.$$

Finally:

$$A_{RF} = 2x_{max}$$

Now suppose the bit stream takes values +1 and −1 and an ideal DAC can produce amplitudes between +1 and −1. An encoder that produces the same RF amplitude as the DAC, will have a complex baseband magnitude of 0.5.

A pyramid stream encoder such as that shown in FIG. 1B may operate at a rate Fs/D, where Fs is the output sampling rate (bit stream output rate). The input signal x may also be sampled at Fs/D and can be a baseband signal or passband signal. A group of D consecutive bits may be described as a codeword:

$$s_n^T = [s_{nD} \, s_{nD-1} \ldots s_{nD-D+1}]$$

and the coefficients of the filter may be grouped in vectors of the form:

$$h_j^T = [h_{jD} \, h_{jD+1} \ldots h_{jD+D-1}]$$

Defining the decimated quantization noise, which is also referred to as residue order 0:

$$r_{0,n} = q_n = x_n - \sum_{k=0}^{K-1} h_k^T s_{n-k}$$

Defining a partial error which is also referred to as the $1^{st}$ order residue:

$$r_{1,n} = x_n - \sum_{k=0}^{K-1} h_k^T s_{n-k}$$

The first order residue becomes:

$$r_{1,n} = x_n - \sum_{k=0}^{K-1} h_k^T s_{n-k} = x_n - \sum_{k=0}^{K-1} h_k^T s_{n-k} + h_0^T s_n$$

In situations in which the quantization error is smaller than $\rho_0$, the first order residue satisfies:

$$r_{1,n} = \left| x_n - \sum_{k=0}^{K-1} h_k^T s_{n-k} \right| \leq \rho_0 + \max_{s \in B^D} |h_0^T s|$$

where $B=\{-1, +1\}$. The first order residue is thus bounded. Following the same idea recursively, for an order j residue:

$$r_{j,n} = x_n - \sum_{k=j}^{K-1} h_k^T s_{n-k}$$

when the order j residue is smaller than a threshold $\rho_j$, the residue order j+1 satisfies:

$$r_{j,n} = \left| x_n - \sum_{k=j+1}^{K-1} h_k^T s_{n-k} \right| \leq \rho_j + \max_{s \in B^D} |h_j^T s|$$

Hence:

$$\rho_{j+1} \leq \rho_j + \max_{s \in B^D} |h_j^T s| \leq \rho_0 + \max_{s \in B^D} |h_0^T s| + \ldots + \max_{s \in B^D} |h_j^T s|$$

When the residues satisfy $|r_{j,n}| \leq \sigma_j$, in particular $$\sigma_j = \max_{s \in B^D} |h_j^T s|,$$

which may be determined iteratively, the above bound on residues has a pyramid shape. The simple analysis above describes pyramid stream encoding: in order for quantization error to be smaller than a given value, the selected bit stream codewords may be chosen such that residues reside inside the pyramid. This is to say that each residue may be smaller than a maximum threshold. Note on the choice of thresholds: using the upper bounds above as thresholds may lead to a too loose (and not so useful) condition, as all codeword candidates may satisfy the constraints and the decision pyramid may not be effective in eliminating poor choices of codewords. Tightening the thresholds too much, on the other hand, may result in decreasing the number of candidate codewords and hence raise the quantization error to undesirable levels. Thus, because each order residue is bounded, it is possible to find a codeword that reduces the zero order residue to a small value at every iteration. In practice, a particular choice of threshold exists that results in both stable operation and low quantization error. A choice that works well in practice is $\rho_j = \sigma_j$.

As above, if h is the impulse response of the filter and D is the decimation ratio, matrix H may be defined as:

$$H = \begin{bmatrix} h_0 & \ldots & h_{D-1} \\ \vdots & \ddots & \vdots \\ h_{(K-1)D} & \ldots & h_{KD-1} \end{bmatrix}$$

The row vector $h_k^T$ is the $k^{th}$ row of the above matrix H. To compute the optimum sequence, the impact of the current decision on K=N/D consecutive error samples is considered. At every time instant n, K residues is defined as:

$$r_{j,n} = -x_{n+j} + \sum_{k=j}^{K-1} h_k^T s_{n+j-k}$$

Alternatively, the residues may be defined using a filtered version of the input stream x instead of the input stream x itself. This allows the two terms in the above equation to have similar magnitude for all residues:

$$r_{j,n} = \sum_{k=j}^{K-1} h_k^T (s_{n+j-k} - x_{n+j-k})$$

In this definition, the signal x may be oversampled to Fs and hence represented as a vector of size D. The input signal x is assumed to be causal, i.e. $x_n=0$, n<0. Because the input signal is band limited, the input signal has a smooth ramp at time n=0 rather than having a sharp discontinuity. For n=0, in the above expression $s_{n-k}=s_{-k}$ has negative indices at start-up. As all binary sequences are also assumed to be causal, therefore $s_{-k}=0$.

The residues at iteration n+1:

$$r_{j,n+1} = -x_{n+j+1} + \sum_{k=j}^{K-1} h_k^T s_{n+1+j-k}$$

and $$r_{j+1,n} = -x_{n+j+1} + \sum_{k=j+1}^{K-1} h_k^T s_{n+1+j-k}$$

The relationship between the residues at time n and the residues at time n+1, for j from 0 to K−2 is:

$$r_{j,n+1} = r_{j+1,n} + h_j^T s_n$$

For j=K−1:

$$r_{K-1,n+1} = -x_{n+K} + h_{K-1}^T s_n$$

$$R_n = \begin{bmatrix} r_{0,n} \\ r_{1,n} \\ \vdots \\ r_{K-1,n} \end{bmatrix} \quad X_n = \begin{bmatrix} 0 \\ \vdots \\ 0 \\ x_{n+K} \end{bmatrix} \quad S = \begin{bmatrix} 0 & 1 & 0 & \ldots & 0 \\ 0 & 0 & 1 & \ddots & \vdots \\ 0 & \ddots & \ddots & \ddots & 0 \\ \vdots & \ddots & \ddots & \ddots & 1 \\ 0 & \ldots & 0 & 0 & 0 \end{bmatrix}$$

Using a matrix/vector notation, the above relationships can be summarized with a single equation:

$$R_n = SR_{n-1} - X_n + Hs_n$$

For simplicity in the above notation the bold vector notation has been dropped. The residue vector at time n can be calculated using the previous state of residue vector, the input signal and the current decisions to minimize the encoder quantization error $r_0$. For minimization, codewords are selected that limit $r_1$, limit $r_1$ also make sure the decisions limit $r_2$, and so on. Luckily, the components of the vector R are highly correlated due to the fact that the input signal is highly oversampled and that the rows of the matrix H are highly correlated. H is of rank D or less as D<K. In some embodiments only M first residues may be minimized due to the above noted correlation in the rows of H, where M<D. In various embodiments, M represents the number of steps in the pyramid, i.e. number of residues being minimized at each iteration. Thus, in some embodiments, only the zeroth order residue may be minimized, while in other embodiments the zeroth and first order residues may be minimized, or the zeroth up to the Mth order residues may be minimized. A tradeoff exists between increasing M to increase maximum input signal power for which the decoder is still stable, and the complexity of the calculation.

Let W be diagonal weighting matrix that has M first diagonal elements non-zero and all remaining diagonal elements equal to 0. A typical choice of diagonal elements:

$$w_{k,k} = \frac{1}{\sigma_k}$$

Defining the norm $\|.\|$ as the sup norm, and $\rho$ a scalar threshold value and Y an arbitrary column vector, the inequality $\|WY\| \leq 1$ implies that $\forall k$, $w_{k,k}|y_k| \leq 1$. So with the above typical choice of W:

$$\forall k, \ |y_k| \leq \sigma_k$$

Using the above observation, at every iteration, the pyramid stream encoder may determine the codeword $s_n$ that achieves the minimum of:

$$\|WR_n\| = \|W(SR_{n-1} - X_n + Hs_n)\|$$

Figure 8:
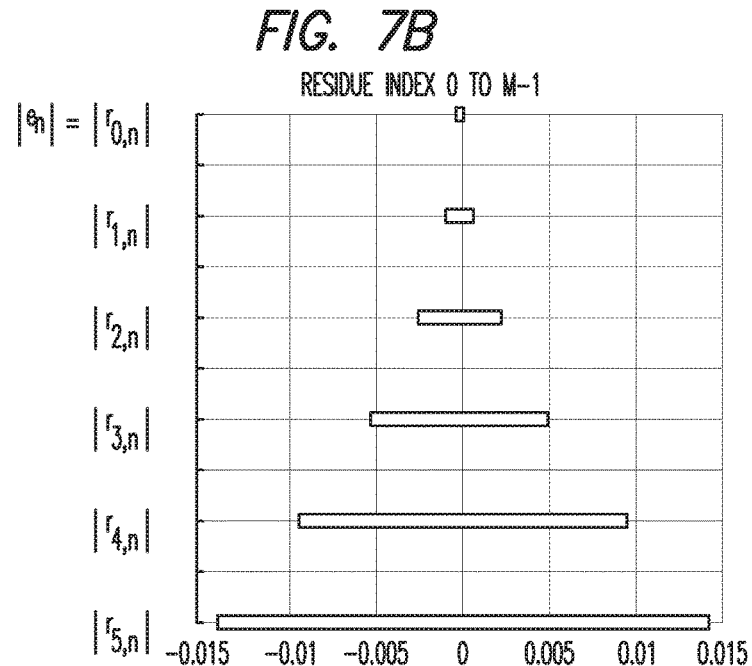
FIG. 8 shows simulated residues for M=6 in accordance with some embodiments.

Using the Euclidian norm (rather than the sup norm, above) may lead to a similar encoder performance. $WX_n = 0$, therefore it is desired to find the $s_n$ that minimizes $\|W(SR_{n-1} + Hs_n)\|$. For a 2-carrier LTE 20 MHz signal, the simulated residues are shown in FIG. 8 for M=6.

Increasing M improves performance but may also increase complexity significantly as dimensionality increases. In some embodiments, two dimensions may be sufficient for this optimization. This is done by taking advantage of the redundancy in the system. To quantify this, the singular value decomposition of WH is used:

$$WH = U_W \Delta_W V_W^H$$

For a practical prototype filter with an oversampling on the order of ~20x, singular values decay rapidly. In some embodiments, the system defined by WH may only have a dimensionality of two, as only the first two singular values are non-zero. All others may be close or equal to zero. This property may be used to reduce the complexity of the recursive loop. Applying this decomposition to WH in the recursive equation of the encoder:

$$WR_n =$$
$$W(SR_n + Hs_n) \Rightarrow U_W^H WR_n = U_W^H W(SR_n + Hs_n) = U_W^H WSR_n + \Delta_W V_W^H s_n$$

Using the Euclidian norm:

$$\|U_W^H WR_n\|_2 = \|U_W^H WSR_n + \Delta_W V_W^H s_n\|_2$$

And since $U_W$ is a unitary matrix:

$$\|WR_n\|_2 = \|U_W^H WSR_n + \Delta_W V_W^H s_n\|_2$$

Let $\Theta_2$ be a matrix size 2×K, and with diagonal elements equal to 1, and I the identity matrix of size K×K. Then, using the property of the singular values:

$$\|WR_n\|_2^2 =$$
$$\|\Theta_2(U_W^H WSR_n + \Delta_W V_W^H s_n)\|_2^2 + \|(I - \Theta_2)(U_W^H WSR_n + \Delta_W V_W^H s_n)\|_2^2 \approx$$
$$\|\Theta_2 U_W^H WSR_n + \Delta_W V_W^H s_n\|_2^2 + \|(I - \Theta_2) U_W^H WSR_n\|_2^2$$

Therefore, in order to minimize $\|U_W^H WSR_n + \Delta_W V_W^H s_n\|_2$, in some embodiments only the first two components $\|\Theta_2 U_W^H WSR_n + \Delta_W V_W^H s_n\|_2$ are minimized.

Now $W' = \Theta_2 U_W^H W$, this modified weighting matrix has only 2×M non-zero elements, and $R'_n = W'SR_n$ is a vector of size 2×1. To minimize $\|W'SR_n + \Delta_W V_W^H s_n\|_2$. Since $W'SR_n$ is a vector of only 2 components, the optimum $s_n$ can be pre-computed and stored in a look-up table. The input to this look-up table (LUT) may be $W'SR_n$.

Figure 5A:
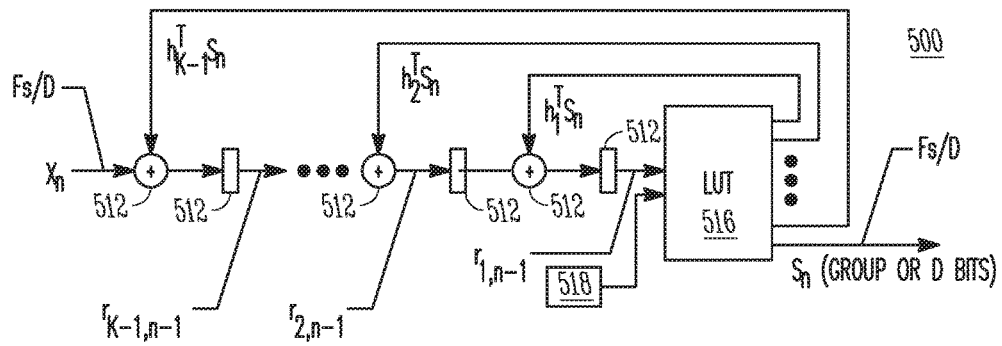
FIG. 5A illustrates a block diagram of a pyramid stream encoder in accordance with some embodiments.
Figure 5B:
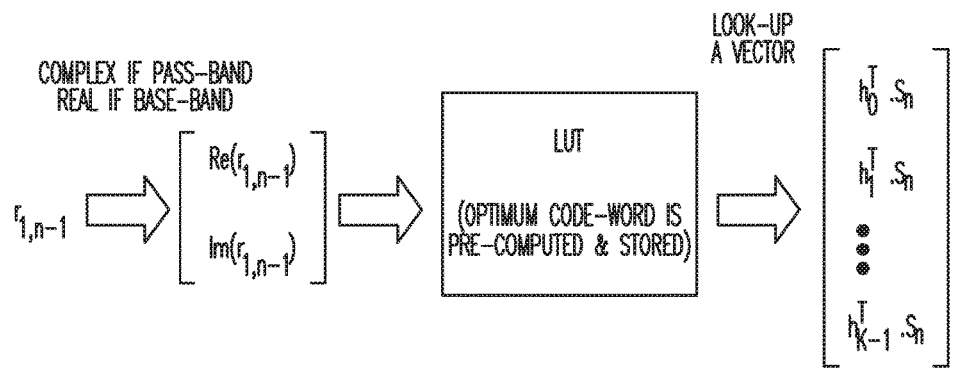
FIG. 5B shows the residues process in accordance with some embodiments.
Figure 5C:
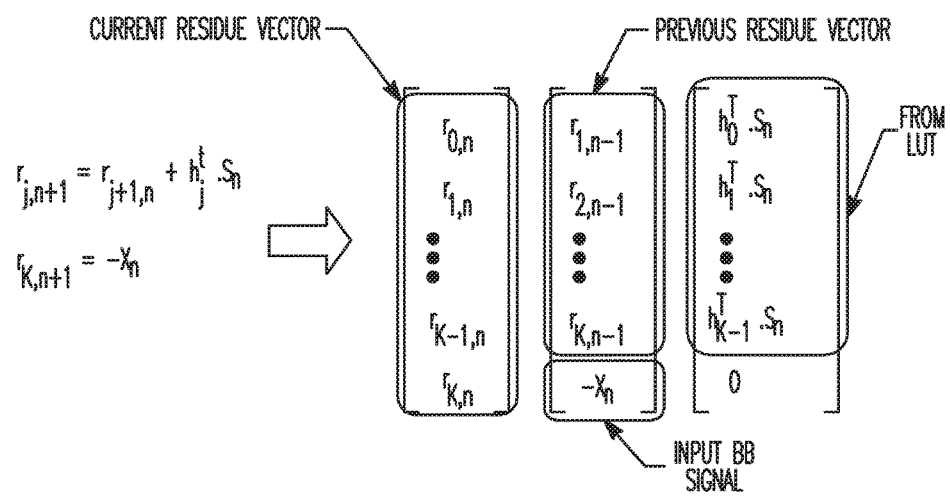
FIG. 5C shows the residue calculation in accordance with some embodiments.

FIG. 5A illustrates a block diagram of a pyramid stream encoder in accordance with some embodiments; FIG. 5B shows the residues process in accordance with some embodiments; FIG. 5C shows the residue calculation in accordance with some embodiments. The pyramid encoder in FIGS. 5A, 6A and 6B may be disposed, for example, in any of the communication devices shown in any of FIGS. 2-4, such as a UE or eNB. Generally, pyramid stream encoders may have single step (M=1) or multiple steps (M>1) using the recursive equation of the residue vector. Pyramid stream encoder 500 shows an example in which M=1. In particular, pyramid stream encoder 500 may include a plurality of adders 512, registers 514 and LUT 516. LUT 516 may contain a plurality of optimum codewords that have been previously computed and stored, as well as filtered codewords shown in the residue vector of FIGS. 5B and 5C. LUT 516 may be a memory, such as SRAM or DRAM. In the embodiment shown in FIG. 5A, the resistor-transistor logic (RTL) may be free from using multipliers.

The input signal x(n) may be a digital signal. Digital, in some embodiments, can be interpreted as 2 level (1 or 0). However, in some embodiments any discrete integer number of levels may be used, e.g., a 2-level signal, a 17-level signal or anywhere in between (or more). While the use of a 2-level signal benefits from simplicity, the use of more levels may translate in lower quantization noise and higher dynamic range but may involve other issues. Thus, each of the input signal x(n) and output signal may contain binary or n-ary symbols, the latter of which may include Quadrature Phase Shift Keying (QPSK), Quadrature amplitude modulation (QAM) or Pulse-amplitude modulation (PAM) symbols, for example. In various embodiments, the digital signal may have real and complex values, may have a real input and output (e.g., a general purpose DAC), may have a complex input and real output (e.g., a passband), may have a complex input and complex output (e.g., communications applications with an I/Q DAC), and may have a real input and a complex output. The use of binary, PAM, and QAM signals expresses the real/complex and 2-level/multi-level cases above.

The input signal x(n) may be supplied to an initial adder 512. The input signal x(n) may be sampled at Fs/D so that pyramid stream encoder 500 may operate at the same rate (e.g., 800 MSPS). The input signal input signal x(n), as shown in FIG. 5B, may be a baseband signal or passband signal. In the former case, the baseband input signal may be a purely real signal, while in the latter case, the passband signal may be a complex signal, containing both a real and imaginary part.

At each adder 512 in pyramid stream encoder 500, a different current residue may be applied to the input (residue) at that adder 512. The residue applied may be a matrix combination of the previous residue vector and the filter response using the codeword from LUT 516, as shown in FIG. 5C. This is to say that, as shown in FIG. 5B, LUT 516 may select a particular codeword $s_n$ as an output and provide the codeword multiplied by a filter response for a particular residue order to the residue. The codeword may be determined offline and looked up in real time. The resulting residue may be clocked to the next stage through registers 514 using the appropriate decimated clock signal ($F_s/D$). The output from the final register 514 may be supplied to LUT 516. Note that weighting matrix W may be the identity matrix in FIG. 5A.

The frequency response of pyramid stream encoder 500 may be given by:

$$S_{s,s}(f) = S_{x,x}(f) + \left(\frac{1}{H(f)}\right)^2 S_{e,e}(f)$$

where e is the quantization error (residue order 0) and H is a lowpass or bandpass filter response. In this equation, the noise shaping transfer function is the inverse of the filter frequency response. In one example, if the filter has 320 taps and D=10, then K=320/D=32 in FIG. 5A.

In some embodiments, LUT 516 may store multiple sets of codewords. The sets of codewords may include both the codeword that provides the best response (e.g., the minimum $\|W(SR_{n-1}-X_n+Hs_n)\|$) and the codeword that provides the next to best response. This, of course, may be extended to an increasing number of responses that are increasingly less desirable. In some embodiments, however, any two (or more) codewords may be selected from rather than the codeword that provides the norm with the minimum value or close to the minimum value. The sets of residue vectors and the corresponding linear combination may then be randomly selected using a selector 518. Selector 518 may randomly generate number, such as a binary number, to select which set of residues to use. In some embodiments, for example, when only two sets are used, the input to LUT 516 may have an extra bit to select between two good candidate codewords that produce a norm close to minimum. This randomization feature may be useful for two tone testing of pyramid encoder 500. Although not shown, this embodiment may be used in FIGS. 6A and 6B. LUT 516 may have different memory banks that store the different sets of digital symbols (codewords) and linear combinations.

Similarly, although input $x_n$ is shown in FIG. 5A as being supplied to a first adder 512 of the set of K adders 512, in some embodiments the input may be added further down the adder chain, closer to the LUT to reduce latency.

Figure 6A:
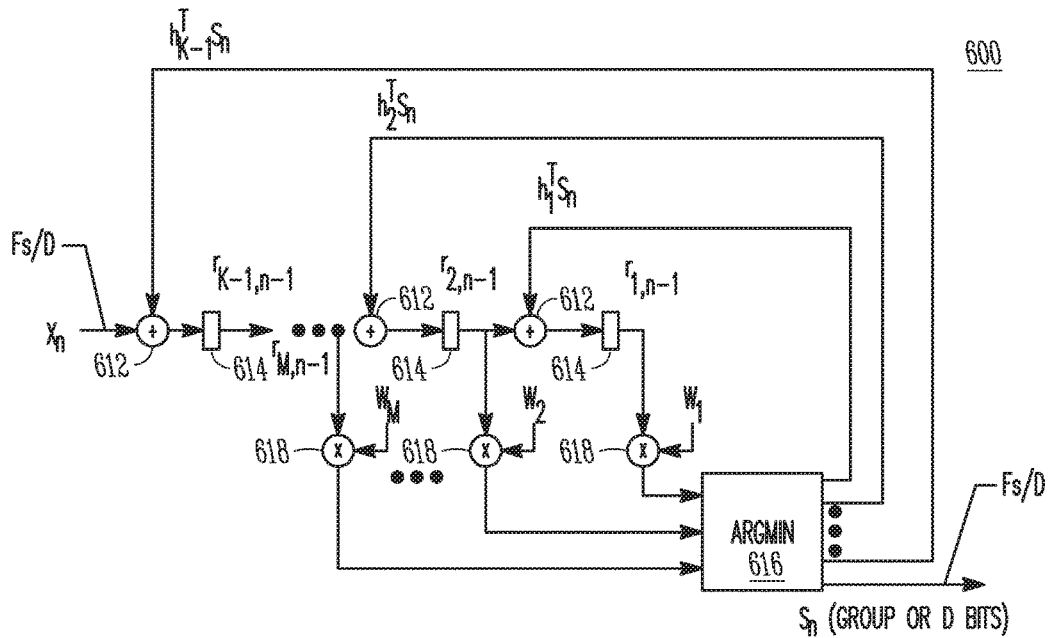
FIGS. 6A and 6B illustrate block diagrams of a pyramid stream encoder in accordance with some embodiments.
Figure 6B:
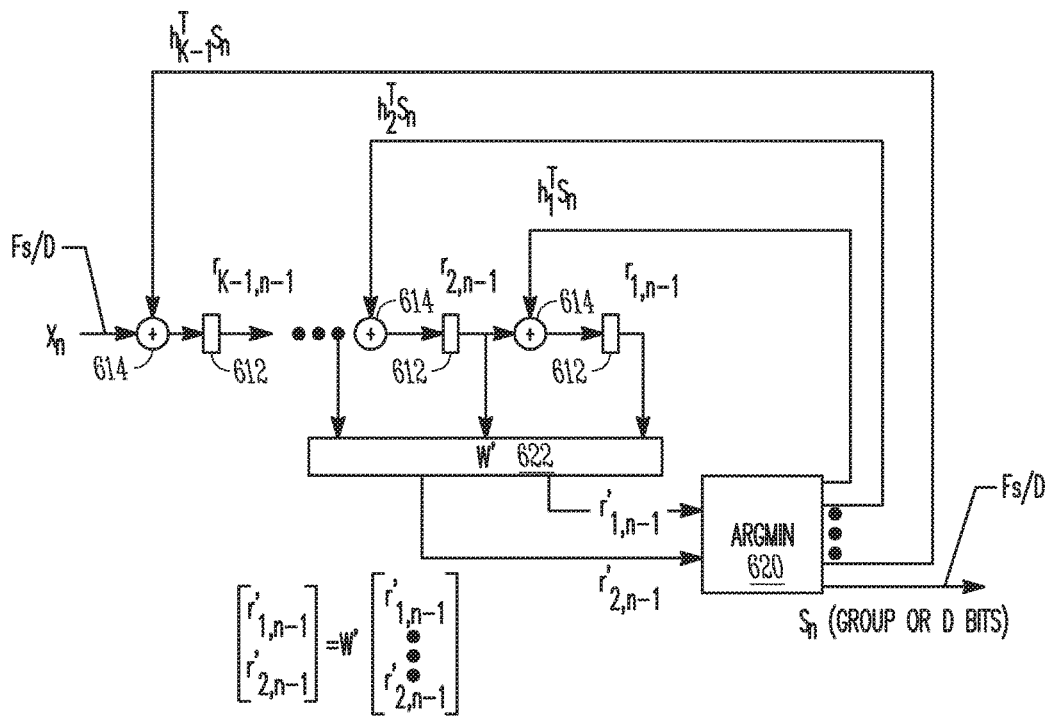

FIGS. 6A and 6B illustrate a block diagram of a pyramid stream encoder in accordance with some embodiments. Pyramid stream encoder 600 may include a plurality of adders 612, registers 614, multipliers 618 and Argmin table 616, which is another version of LUT 516 that provides a residue vector whose norm (Sup or Euclidian, for example) is minimized. Note that argmin(expression) is the value of the variable for which the expression in the parenthesis is minimized. Pyramid stream encoder 600 shows an example in which M>1. This is to say that unlike the arrangement in FIG. 5A, in which only the output from the final register 514 may be supplied to LUT 516, M residues are supplied to Argmin table 616 and used to determine the appropriate codeword. The input signal x(n) may be sampled at Fs/D so that pyramid stream encoder 600 may operate at the same rate (e.g., 800 MSPS).

Similar to FIG. 5A, a different current residue from Argmin table 616 may be applied to the input (residue) at each adder 612. The residue applied may be a matrix combination of the previous residue vector and the filter response using the codeword from Argmin table 616. The resulting residue may be clocked to the next stage through registers 614 using the appropriate clock signal. Argmin table 616 may contain a plurality of optimum codewords that have been previously computed and stored. The codeword is selected in this embodiment, however, to minimize the weighted residue vector $s_n = \text{argmin}(\|W(SR_{n-1}+Hs)\|)$. The value within the argmin function may be a Sup or Euclidian norm. The different weighting coefficients are given by $w_k$ and are applied to the different multipliers 618. The weighted residues may then be supplied to Argmin table 616.

FIG. 6B shows a pyramid stream encoder having a simplified feedback loop in a manner similar to FIG. 5A. FIG. 6B, shows adders 612, registers 614, LUT 620 and weight module W' 622 in pyramid stream encoder 600. Weight module 622 may be a matrix of size 2×M whose outputs are supplied to LUT 620. Thus, as shown, although all of the residues may be supplied to weight module W' 622, only two weighted residues may be provided to LUT 620 from weight module W' 622.

Whether 1 or more residues are used, the input signal x(n) may be supplied to a pyramid stream encoder with a pre-determined set of coefficients. The pyramid stream encoder iteratively computes groups of D digital symbols and applies each group of digital symbols serially to an output signal. The pyramid stream encoder selects each group of digital symbols that minimizes the norm of a residue vector. In some embodiments, the residue vector may be weighted by applying pre-determined weighting coefficients to the components of the residue vector. Each component of the residue vector may be defined by forming the difference between a current or past sample of the input signal and a linear combination of current and past groups of the digital symbols by multiplying a subset of the predetermined set of coefficients to the groups of digital symbols. The norm of the weighted residue vector may be evaluated at a rate D times slower than the sampling rate of the output signal.

Simulations of M=1 and M=6 with LTE-A waveforms (IF between 60-120 MHz (baseband) and two-tone signal centered around 2.14 GHz (passband)) show an increase of dynamic range from 55 dB to 59 dB, an increase in maximum output signal power by about 4 dB, and nearly doubling of the bandwidth, when increasing M from 1 to 6. Using a 10 GBPS Serializer-Deserializer (SerDes) in 28 nm CMOS technology, a two-tone spurious free dynamic range (SFDR) of 80 dB and 60 dB adjacent channel leakage ratio (ACLR) was measured. In some embodiments, the values of weighting matrix W may differ substantially with higher M. For example, $W_1$ may be large (e.g., 20) and $W_{\neq 1}$ (e.g., 1) for M=6.

Example 1 is an apparatus of electronic equipment comprising: processing circuitry arranged to provide a digital signal; and a pyramid stream encoder arranged to: receive the digital signal; select groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients; and provide the groups of D digital symbols serially in time as the output signal.

In Example 2, the subject matter of Example 1 optionally includes that the pyramid stream encoder is further arranged to: select each group of D digital symbols such that the norm is smaller than one.

In Example 3, the subject matter of any one or more of Examples 1-2 optionally include, further comprising: a lookup table (LUT) comprising sets of D digital symbols, the sets of D digital symbols comprising a set of D digital symbols that each provides a weighted residue vector having a norm with different values; and a selector arranged to generate a random number to select which of the sets of D digital symbols of the LUT to form the residue vector.

In Example 4, the subject matter of any one or more of Examples 1-3 optionally include the different groups of D digital symbols comprise current and past groups of D digital symbols.

In Example 5, the subject matter of any one or more of Examples 1-4 optionally include the digital signal is a baseband signal, and the predetermined filter coefficients are real and have a lowpass response.

In Example 6, the subject matter of any one or more of Examples 1-5 optionally include the digital signal is a passband signal, and the predetermined filter coefficients are complex and have a bandpass response.

In Example 7, the subject matter of any one or more of Examples 1-6 optionally include, further comprising: a plurality of adders each arranged to combine one of a sample of the digital signal and one of the components of the residue vector with one of the linear combinations; a plurality of registers disposed between adjacent adders and arranged to clock through an output from one of the adjacent adders to an input of another of the adjacent adders; and a look up table (LUT) storing pre-computed groups of D symbols, and linear combinations of D symbols and to which at least one of the components of the residue vector is supplied as an input to the LUT.

In Example 8, the subject matter of Example 7 optionally includes that: the LUT is arranged to receive a component of the residue vector from a register most proximate to the LUT as the input and is free from reception of remaining components of the residue vector as the input.

In Example 9, the subject matter of any one or more of Examples 7-8 optionally include, further comprising: a weight module arranged to weight a plurality of the components of the residue vector with the predetermined weighting coefficients to produce the weighted residue vector, a limited number of components of the weighted residue vector supplied to the LUT as the input of the LUT.

In Example 10, the subject matter of Example 9 optionally includes that: the limited number of components is at most two.

In Example 11, the subject matter of any one or more of Examples 1-10 optionally include for every iteration: $\|WR_n\|=\|W(SR_{n-1}-X_n+Hs_n)\|$ is minimized, where W is a diagonal weighting matrix, H is a filter matrix, S is shift-by-one matrix vector and R is the residue vector:

$$R_n = \begin{bmatrix} r_{0,n} \\ \vdots \\ r_{K-1,n} \end{bmatrix}, X_n = \begin{bmatrix} 0 \\ \vdots \\ 0 \\ x_{n+K} \end{bmatrix}, H = \begin{bmatrix} h_0 & \cdots & h_{D-1} \\ \vdots & \ddots & \vdots \\ h_{(K-1)D} & \cdots & h_{KD-1} \end{bmatrix},$$

$$S = \begin{bmatrix} 0 & 1 & 0 & \cdots & 0 \\ 0 & 0 & 1 & \ddots & \vdots \\ 0 & \ddots & \ddots & \ddots & 0 \\ \vdots & \ddots & \ddots & \ddots & 1 \\ 0 & \cdots & 0 & 0 & 0 \end{bmatrix}.$$

In Example 12, the subject matter of any one or more of Examples 1-11 optionally include that the groups of D digital symbols are selected from one of binary symbols and n-ary symbols including Quadrature Phase Shift Keying (QPSK) symbols, Quadrature amplitude modulation (QAM) symbols and Pulse-amplitude modulation (PAM) symbols.

In Example 13, the subject matter of any one or more of Examples 1-12 optionally include that the subject matter of any one or more of Examples 1-11 optionally include that the norm of the weighted residue vector is evaluated at a rate D times slower than a sampling rate of an output signal.

In Example 14, the subject matter of any one or more of Examples 1-13 optionally include, further comprising: an antenna configured to provide the RF signal to a receiver.

Example 15 is a method of reducing quantization noise, the method comprising: receiving a digital signal; iteratively computing groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients, the norm of the weighted residue vector evaluated at a rate D times slower than a sampling rate of an output signal; and providing the groups of D digital symbols as the output signal.

In Example 16, the subject matter of Example 15 optionally includes: selecting each group of D digital symbols such that the norm is smaller than one.

In Example 17, the subject matter of any one or more of Examples 14-15 optionally include, further comprising: a lookup table (LUT) comprising sets of D digital symbols, the sets of D digital symbols comprising a set of D digital symbols that each provides a weighted residue vector having a norm with different values; and selecting from which of the sets of D digital symbols of the LUT to form the residue vector using a random number.

In Example 18, the subject matter of any one or more of Examples 14-16 optionally include, further comprising: combining one of a sample of the digital signal and one of the components of the residue vector with one of the linear combinations at each of a plurality of adders; clocking through an output from one adder to an input of an adjacent adder using one of a plurality of registers; and storing pre-computed groups of D symbols and linear combinations of D symbols in a look up table (LUT), and supplying at least one of the components of the residue vector as an input to the LUT.

In Example 19, the subject matter of Example 18 optionally includes receiving at the LUT a component of the residue vector from a register most proximate to the LUT as the input.

In Example 20, the subject matter of Example 18 optionally further comprises: multiplying a plurality of the components of the residue vector with the predetermined weighting coefficients using a weight module to produce the weighted residue vector, a limited number of components of the weighted residue vector supplied to the LUT as the input of the LUT.

In Example 21, the subject matter of Example 20 optionally includes that: the limited number of components is at most two.

Example 22 is a computer-readable storage medium that stores instructions for execution by one or more processors of a user equipment (UE) to communicate with an evolved NodeB (eNB), the one or more processors to configure the low power communication device to: receive a digital signal; iteratively compute groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients, the norm of the weighted residue vector evaluated at a rate D times slower than a sampling rate of an output signal; and provide the groups of D digital symbols as the output signal.

In Example 23, the subject matter of Example 22 optionally includes that the one or more processors further configure UE to: select each group of D digital symbols such that the norm is smaller than one.

Although an embodiment has been described with reference to specific example embodiments, it will be evident that various modifications and changes may be made to these embodiments without departing from the broader spirit and scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, communication device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus of electronic equipment comprising:
a pyramid stream encoder arranged to:
   receive a digital signal;
   encode the digital signal by at least selection of groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients; and
   provide the groups of D digital symbols serially in time as the output signal.

2. The apparatus of claim 1, wherein the pyramid stream encoder is further arranged to:
select each group of D digital symbols such that the norm is smaller than one.

3. The apparatus of claim 1, further comprising:
a lookup table (LUT) comprising sets of D digital symbols, the sets of D digital symbols comprising a set of D digital symbols that each provides a weighted residue vector having a norm with different values; and
a selector arranged to generate a random number to select which of the sets of D digital symbols of the LUT to form the residue vector.

4. The apparatus of claim 1, wherein:
the different groups of D digital symbols comprise current and past groups of D digital symbols.

5. The apparatus of claim 1, wherein:
the digital signal is a baseband signal, and the predetermined filter coefficients are real and have a lowpass response.

6. The apparatus of claim 1, wherein:
the digital signal is a passband signal, and the predetermined filter coefficients are complex and have a bandpass response.

7. The apparatus of claim 1, further comprising:
a plurality of adders each arranged to combine one of a sample of the digital signal and one of the components of the residue vector with one of the linear combinations;
a plurality of registers disposed between adjacent adders and arranged to clock through an output from one of the adjacent adders to an input of another of the adjacent adders; and
a look up table (LUT) storing pre-computed groups of D symbols, and linear combinations of D symbols and to which at least one of the components of the residue vector is supplied as an input to the LUT.

8. The apparatus of claim 7, wherein:
the LUT is arranged to receive a component of the residue vector from a register most proximate to the LUT as the input and is free from reception of remaining components of the residue vector as the input.

9. The apparatus of claim 7, further comprising:
a weight module arranged to weight a plurality of the components of the residue vector with the predetermined weighting coefficients to produce the weighted residue vector, a limited number of components of the weighted residue vector supplied to the LUT as the input of the LUT.

10. The apparatus of claim 9, wherein:
the limited number of components is at most two.

11. The apparatus of claim 1, wherein:
for every iteration:

$$\|WR_n\| = \|W(SR_{n-1} - X_n + Hs_n)\|$$

is minimized, where W is a diagonal weighting matrix, H is a filter matrix, S is shift-by-one matrix vector and R is the residue vector:

$$R_n = \begin{bmatrix} r_{0,n} \\ \vdots \\ r_{K-1,n} \end{bmatrix}, X_n = \begin{bmatrix} 0 \\ \vdots \\ 0 \\ x_{n+K} \end{bmatrix}, H = \begin{bmatrix} h_0 & \cdots & h_{D-1} \\ \vdots & \ddots & \vdots \\ h_{(K-1)D} & \cdots & h_{KD-1} \end{bmatrix},$$

$$S = \begin{bmatrix} 0 & 1 & 0 & \cdots & 0 \\ 0 & 0 & 1 & \ddots & \vdots \\ 0 & \ddots & \ddots & \ddots & 0 \\ \vdots & \ddots & \ddots & \ddots & 1 \\ 0 & \cdots & 0 & 0 & 0 \end{bmatrix}.$$

12. The apparatus of claim 1, wherein the groups of D digital symbols are selected from one of binary symbols and n-ary symbols including Quadrature Phase Shift Keying (QPSK) symbols, Quadrature amplitude modulation (QAM) symbols and Pulse-amplitude modulation (PAM) symbols.

13. The apparatus of claim 1, wherein the norm of the weighted residue vector is evaluated at a rate D times slower than a sampling rate of an output signal.

14. The apparatus of claim 1, further comprising:
an antenna configured to provide the RF signal to a receiver.

15. A method of reducing quantization noise, the method comprising:
receiving a digital signal;
iteratively determining groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients, the norm of the weighted residue vector evaluated at a rate D times slower than a sampling rate of an output signal; and
providing the groups of D digital symbols as the output signal.

16. The method of claim 15, further comprising:
selecting each group of D digital symbols such that the norm is smaller than one.

17. The method of claim 15, further comprising:
a lookup table (LUT) comprising sets of D digital symbols, the sets of D digital symbols comprising a set of D digital symbols that each provides a weighted residue vector having a norm with different values; and
selecting from which of the sets of D digital symbols of the LUT to form the residue vector using a random number.

18. The method of claim 15, further comprising:
combining one of a sample of the digital signal and one of the components of the residue vector with one of the linear combinations at each of a plurality of adders;
clocking through an output from one adder to an input of an adjacent adder using one of a plurality of registers; and
storing pre-computed groups of D symbols and linear combinations of D symbols in a look up table (LUT), and supplying at least one of the components of the residue vector as an input to the LUT.

19. The method of claim 18, further comprising:
receiving at the LUT a component of the residue vector from a register most proximate to the LUT as the input.

20. The method of claim 18, further comprising:
multiplying a plurality of the components of the residue vector with the predetermined weighting coefficients using a weight module to produce the weighted residue vector, a limited number of components of the weighted residue vector supplied to the LUT as the input of the LUT.

21. The method of claim 20, wherein:
the limited number of components is at most two.

22. A computer-readable storage medium that stores instructions for execution by one or more processors of a user equipment (UE) to communicate with an evolved NodeB (eNB), the one or more processors to configure the low power communication device to:
receive a digital signal;
iteratively determine groups of D digital symbols for the digital signal such that each group of D digital symbols minimizes a norm of a weighted residue vector, the weighted residue vector formed by application of predetermined weighting coefficients to components of a residue vector, each component of the residue vector comprising a difference between a sample of the digital signal and a linear combination of different groups of D digital symbols with predefined filter coefficients, the norm of the weighted residue vector evaluated at a rate D times slower than a sampling rate of an output signal; and provide the groups of D digital symbols as the output signal.

23. The medium of claim 22, wherein the one or more processors further configure UE to:
select each group of D digital symbols such that the norm is smaller than one.

* * * * *